United States Patent [19]

English

[11] 4,325,102
[45] Apr. 13, 1982

[54] VARIABLE CAPACITOR FOR USE IN A KEYBOARD

[75] Inventor: George P. English, Hayden Lake, Id.

[73] Assignee: General Instrument Corporation, Clifton, N.J.

[21] Appl. No.: 195,743

[22] Filed: Oct. 10, 1980

[51] Int. Cl.³ .............................................. H01G 5/16
[52] U.S. Cl. .............................. 361/288; 200/DIG. 1; 361/278
[58] Field of Search .............................. 361/288, 278; 200/DIG. 1

[56] References Cited

U.S. PATENT DOCUMENTS

| | | | |
|---|---|---|---|
| 3,797,630 | 3/1974 | Zilkha | 361/288 X |
| 3,900,712 | 8/1975 | Fukaho | 361/288 |
| 4,090,229 | 5/1978 | Cewgil | 361/288 |
| 4,209,819 | 6/1980 | Seignemartin | 361/288 |

Primary Examiner—Elliot A. Goldberg
Attorney, Agent, or Firm—Mason, Kolehmainen, Rathburn & Wyss

[57] ABSTRACT

A variable capacitor for use in a keyboard comprises a stationary capacitor plate of thin, conductive, sheet material on an insulative substrate and having a substantially planar face. A movable member formed from a single piece of conductive sheet material includes a movable capacitor plate having a substantially planar, and continuous face in overlaying spaced apart relation to the stationary plate. The movable plate is struck from the body of a short length of a strip of sheet material to provide a pair of longitudinal side edges and an outer free edge transverse thereto, with a portion opposite the free outer edge projecting laterally outward and integral with a pair of supporting, spring-like, deflectable legs which extend downwardly toward the substrate to join an integral base strip mounted on the substrate. The legs support the movable capacitor plate above the stationary capacitor plate for controlled movement about a lateral pivot axis toward and away from the stationary plate to vary the capacity of the capacitance. A separate, washer-like element is mounted above the movable capacitor plate for engagement therewith and is supported on a plunger mounted for longitudinal movement on an axis normal to the substrate. The plunger is biased away from the movable capacitor plate and is adapted to move the washer-like element toward the capacitor plate to increase capacitance in response to the manual depression of a key or push button on a keyboard or the like above the substrate.

11 Claims, 2 Drawing Figures

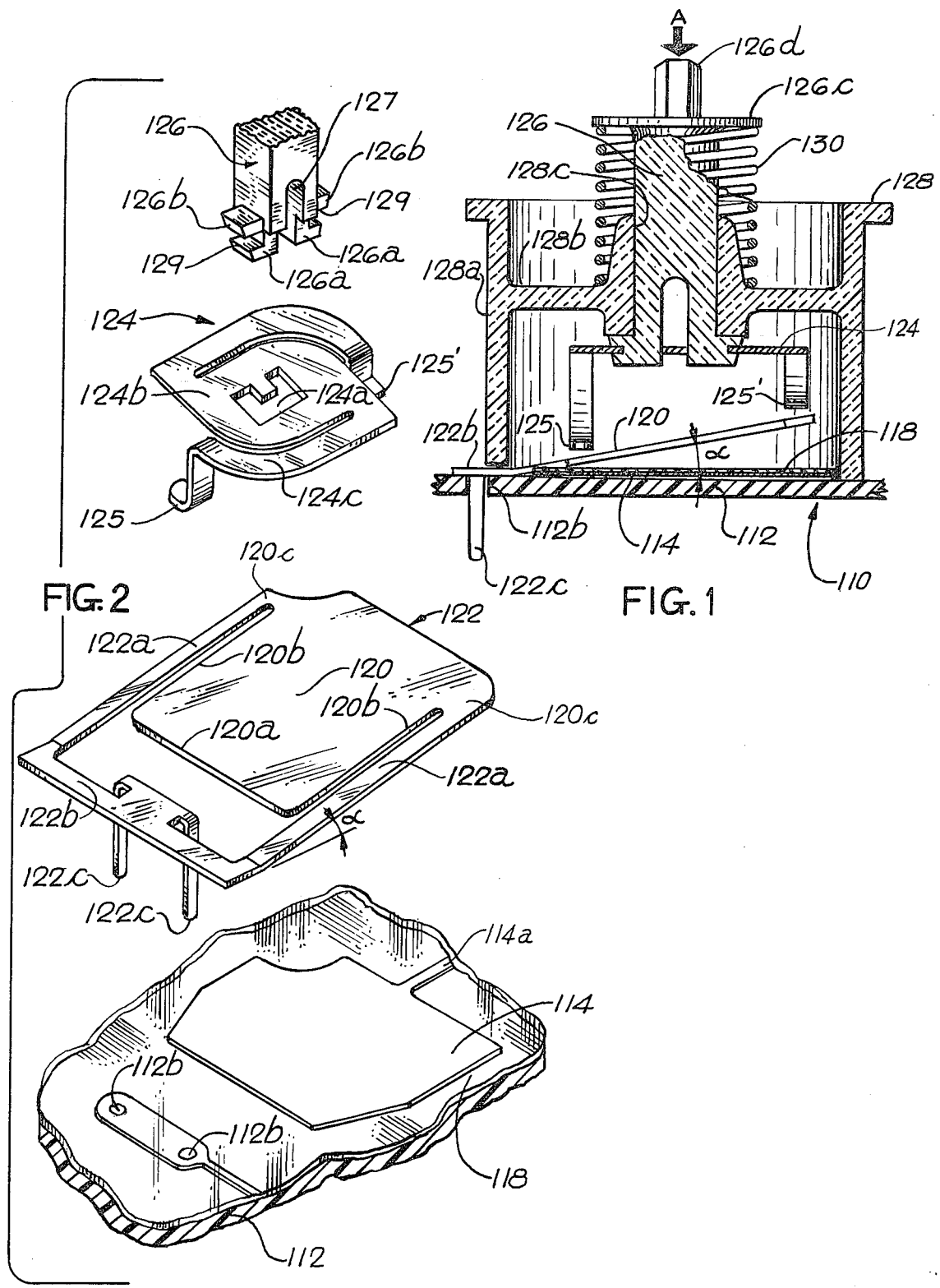

VARIABLE CAPACITOR FOR USE IN A KEYBOARD

BACKGROUND OF THE INVENTION

1. Field of the Invention

The present invention relates to a variable capacitor for use in a keyboard and more particularly, relates to a capacitive type switch key which provides a generally linear feel for manually operated keys on a capacitive type keyboard of a computer, calculator or other electronic device.

2. Description of the Prior Art

Variable capacitor type keys for keyboards of computers, electronic calculators and the like are known. One such capacitive key useful for a keyboard is shown in U.S. Pat. No. 4,090,229. Mechanical contact switches, snap action switches, and thermostatically operated switches are also known and U.S. Pat. Nos. 2,700,079; 3,196,233; and 3,800,104 show various types of switches of the prior art.

OBJECTS OF THE INVENTION

It is an object of the invention to provide a new and improved variable capacitor for use in a keyboard or more particularly, a new and improved capacitive type key for use in a keyboard of a calculator, computer or other electronic device.

Another object of the present invention is to provide a key operated variable capacitor which has a substantially linear feel when a push button is manually depressed.

Another object of the present invention is to provide a new and improved capacitive type key wherein a movable capacitor plate is formed from a single piece of conductive sheet material in a manner whereby a full and uninterrupted surface area of the movable capacitor plate is available to provide a maximum value capacitance upon movement toward a stationary capacitor place.

Still another object of the present invention is to provide a new and improved variable capacitor of the character described which does not require a cut out or tab element to be struck from the surface area of the capacitor plate and thus eliminates a point or area of stress concentration.

Still another object of the present invention is to provide a new and improved variable capacitor of the character described which does not require an additional spring assembly or springs for supporting a movable capacitor plate and yet does not require any tabs or legs to be struck out of the body of the plate which would reduce the capacity thereof.

Still another object of the present invention is to provide a new and improved variable capacitor having a novel element for operationally interconnecting a movable plunger and a movable capacitative plate to provide a substantially linear feel when the plunger is depressed.

Yet another object of the present invention is to provide a new and improved variable capacitor key of the character described which is relatively low in cost, relatively simple in construction and operation and which provides for overtravel of an operating plunger after maximum capacity is reached.

BRIEF SUMMARY OF THE INVENTION

The foregoing and other objects and advantages of the present invention are accomplished in an illustrated embodiment comprising a variable capacitor for use with a key on a keyboard or control panel. The capacitor has a stationary capacitor plate formed of thin, conductive, sheet material on an insulative substrate such as a printed circuit board and having a substantially planar, upper capacitor face. A movable member formed from a single piece of thin conductive sheet material includes a capacitor plate having a substantially planar and continuous or uninterrupted capacitor face in overlying, spaced apart relation with the upper face of the stationary capacitor plate. The movable capacitor plate is struck from the body of a short length of strip of conductive sheet material and is formed with a pair of free side edges and an outer free edge transverse thereto. A portion opposite the outer free edge projects laterally outwardly of opposite sides and is integral with a pair of supporting, spring-like deflectable legs which are disposed on opposite sides and which slope downwardly to join an integral base mounted on the insulative substrate. The integral spring-like legs provide support for the movable plate for controlled movement toward and away from the fixed capacitor plate. A separate washer-like element is mounted above the movable plate for resiliently biasing the movable plate toward the stationary plate. The spring-like element is mounted on the lower end of a plunger supported for movement toward and away from the substrate and adapted to be biased toward the capacitor plate upon depression of a key or a keyboard or control panel. The plunger is biased away from the plate to provide a minimum capacity until the key is manually depressed.

BRIEF DESCRIPTION OF THE DRAWINGS

For a better understanding of the invention, reference should be had to the following detailed description taken in conjunction with the drawings, in which:

FIG. 1 is a cross-sectional view of a new and improved variable capacitor for a keyboard constructed in accordance with the features of the present invention; and FIG. 2 is an exploded perspective view illustrating the major components of the variable capacitor in accordance with the present invention.

DESCRIPTION OF THE PREFERRED EMBODIMENT

Referring now more particularly to the drawings, therein is illustrated a new and improved variable capacitor especially adapted for use with the keys of a control panel or a keyboard of a computer terminal, calculator or other electronic device. The capacitor is constructed in accordance with the features of the present invention and is referred to generally by the reference numeral 110. The capacitor 110 is mounted on an insulative substrate 112 of a printed circuit board or the like on an upper surface thereof below a key element or key (not shown) above the substrate. The key is depressed downwardly to change or vary the capacitance from a minimum to a higher value.

The capacitor includes a generally rectangular-shaped, stationary or fixed capacitor plate 114 formed of etched out, conductive, sheet material on the substrate 112 with a leg 114a for making electrical connection with circuits or other electronic components on the circuit board. The fixed capacitor plate 114 is covered with a thin layer of dielectric material 118 silk screened onto the surface to form a dielectric for the variable capacitor.

The capacitor also includes a generally rectangular-shaped movable capacitor plate 120 which is struck from a short length of strip of conductive sheet material and indicated by the numeral 122 as a whole. The movable plate 120 provides an uninterrupted or continuous lower face or conductive surface that is spaced above the fixed capacitor plate 114 in overlying relation. The movable capacitor plate includes a free outer edge 120a and a pair of longitudinal side edges 120b which are formed when the rectangular central portion of the capacitor plate 20 is struck out from the body of the sheet metal strip in a punch press operation or the like.

Opposite the free outer edge 120a, the sheet metal member 122 is formed with a pair of laterally outwardly extending corner portions 120c which are integrally interconnected with a pair of downwardly sloping, side members which form spring-like, deflectable legs 122a disposed on opposite sides of the side edges 120b of the movable capacitor plate.

At the lower ends, the spring-like legs 122a are integrally joined with a support strip or base portion 122b extending parallel of the free outer edge 120a and spaced below as illustrated. The mounting strip or base portion 122b is formed with a pair of downwardly projecting solder lugs or bend tabs 122c which may extend through openings 112b formed in the substrate 112. The tabs are used for pivotably securing the member 122 in place on the substrate of the circuit board when the tabs 122c are bent over against the undersurface of the substrate. These lugs also provide convenient electrical terminals for making electrical connection with other components on the circuit board.

The short strip of conductive sheet material 122 is initially formed in a punch press or the like by striking out the rectangular-shaped movable capacitor plate 120 from the main body thereof, to form the spring-like, side legs 122a. The legs and plate 120 are then set or deflected upwardly of the base strip 122b at an angle "alpha" so that in a normal or minimum capacity position, the movable capacitor plate 120 is spaced a maximum distance from the upper surface of the fixed capacitor plate 114 to provide a minimum capacitance value.

Downward pressure on the movable capacitor plate 120 exerted in the direction of the arrow "A" (FIG. 1) causes the spring-like, side legs 122a to deflect downwardly and reduce the angle "alpha" until the lower surface of the movable plate is spaced closely to or against the insulating dielectric sheet 118. In this position, the variable capacitor 110 has a maximum value of capacitance. When downward pressure on the movable capacitor plate is released, the legs 122a deflect back to the original set and move the plate 120 back toward the normal position as shown in FIG. 1.

In accordance with the present invention, downward force is exerted to deflect the movable capacitor plate 120 from the minimum capacitance position as shown to a maximum capacitance position as described, by means of washer-like element 124 having an "E"-shaped central opening 124a and a generally rectangular-shaped central portion 124b having one pair of rounded corners at diagonally opposite positions. At the other corners, the element is provided with a pair of arcuately curved contact fingers 124c which are integrally joined to the peripheral edge of the central portion. These arcuately curved fingers follow around the curved corners and terminate at free outer end portions 125 and 125' which extend downwardly at right angles and which have feet at the lower ends adapted to make contact against the upper surface of the rectangular-shaped, movable capacitor plate 120.

The washer-like element 124 is staked onto a bifurcated lower end portion of a plunger 126 having a polygonal-shaped transverse cross-section and disposed for sliding movement in a hollow tubular support structure 128. The structure 128 includes a cylindrical outer side wall 128a and an intermediate web 128b parallel of the substrate and formed with a tubular wall portion 128c forming a hollow bore adapted to receive an intermediate portion of the plunger 126 to provide a guide therefor during movement of the plunger toward and away from the upper surface of the movable capacitor plate 120.

The bifurcated lower end of the plunger includes a pair of longitudinally extending deflectable fingers 126a separated by an axial slot 127 and each finger is formed with a pair of spaced apart "Christmas Tree"-like, outwardly extending ribs 126b formed on opposite sides of an edge slot 129 adapted to receive the adjacent edge portion of the element 124 along an edge of the polygonal-shaped central opening 124a.

The element 124 is formed of metal or material chosen to provide a desired spring force constant for the deflectable curved arms 124c and the spring force constant may be selected on a basis completely independent of the spring force deflection constant of the spring-like legs 122a of the movable capacitor element 122. Accordingly, the variable capacitor 110 may be constructed to have a wide variety of range of force values that provide a different mechanical feel when a key or pushbutton is activated to move the plate 120 from the minimum capacity position downwardly toward a position of greater capacitance.

The design of the element 124 permits the value of the deflection force on the capacitor that is necessary to change from minimum to maximum capacity to be selected independently of the thickness, dimensions or type of material that is used for the strip element 122 forming the movable capacitor plate 120. Moreover, the unique construction of the plunger 126 and the element 124 permits easy and rapid assembly of these components in a mass production process. The element 124 is shown with a single pair of deflectable, curved arms 124c but additional arms could be provided if desired or needed to more evenly load the upper surface of the movable capacitor plates 120.

Upward travel of the plunger 126 within the bore 128c of the supporting structure 128 is limited by engagement of the upper surface of the upper ribs 126b with the lower end surface of the tubular guideway 128c. An upward or return biasing force on the plunger is provided by a coil spring 130 having a lower end convolution seated and centered about the central tubular element 128c on the web 128b. The upper end of the spring 130 is engaged against the lower surface of an annular or circular end ring 126c formed adjacent the upper end of the body of the plunger.

During downward movement of the plunger 126 the compression of the coil spring 130 also contributes to a generally linear mechanical feel on the key or pushbutton. An axial projection 126d extends upwardly above the annular end ring 126c on the plunger and is adapted for contact with a key or pushbutton of a keyboard or control panel.

The variable capacitor 110 is illustrated in FIG. 1 in a minimum capacity position wherein the lower ends of the restrictive legs 125 and 125' are spaced above the plate 120.

When a key or other element on a keyboard or control panel is depressed downwardly and engages the projection 126d to exert force downwardly in the direction of the arrow "A", the coil spring 130 is compressed. Subsequently, the legs 125 and 125' engage the movable capacitor plate 120 and move the plate toward the upper surface of the insulating dielectric sheet 118 to minimum capacitance value. Further downward movement or overtravel of the plunger 126 results in deflection of the curved spring arms 124c. Deflection of the arms accommodates overtravel of the plunger 126 and provides a distinct difference in mechanical feel after a maximum capacitance position is achieved. When key pressure is released, the legs 125 and 125' return to the normal condition and the spring legs 122a deflect the plate 120 back toward the position of FIG. 1 while the coil spring 130 is returning the plunger 126 upwardly.

The novel variable capacitor 110 in accordance with the present invention provides a new and unique keyboard capacitance wherein the mechanical feel associated with depression of a key on a keyboard may be selectively controlled and determined by an element 124 which is separate and independent of a movable capacitor element 122. In addition, a maximum surface area of the movable plate 120 is available for use as a capacitance and there are no portions thereof that are struck out, slotted out or cut away which would result in decreased capacitance values. The variable capacitor of the present invention is readily adapted for manufacture on a mass production basis, is relatively simple in construction and operation and is economical to produce.

I claim:

1. A variable capacitor for use in a keyboard, comprising:
   a stationary capacitor plate of thin conductive sheet material on an insulative substrate and having a substantially planar face;
   a movable member formed from a piece of thin, conductive, sheet material and including a movable capacitor plate having a substantially planar continuous face in overlying, spaced apart relation to said face of said stationary capacitor plate;
   said movable plate being struck from the body of said sheet material to provide a pair of free side edges and an outer free edge transverse thereto, a portion opposite said outer free edge projecting laterally outward of said free side edges and integral with a pair of supporting spring-like deflectable legs disposed on opposite sides of said free side edges and sloping downwardly toward said substrate to join an integral base strip spaced below and parallel of said outer free edge and adapted for mounting on said substrate to support said movable plate above said stationary plate for movement toward and away from the same to vary the capacity therebetween;
   a plunger mounted for movement toward and away from said movable plate supporting said element and biased away from said movable plate, and
   a separate, spring washer-like element attached to a plunger and engagable with said movable plate and movable in a direction normal to said substrate forcing said movable plate toward said stationary plate into a maximum capacity position wherein said plates are fully engaged, said spring washer-like element having means providing a substantially linear force characteristic on said plunger during continued movement thereof toward said fixed plate after said maximum capacity position is obtained.

2. The variable capacitor of claim 1 wherein said separate spring washer-like element includes a central body having an opening adjacent the center thereof for receiving said an end of said plunger and a plurality of curved, contact arms integrally joined with an outer edge of said central body and extending downwardly thereof so that free outer ends of the arms are in contact against said movable plate on opposite sides.

3. The variable capacitor of claim 2 wherein a sheet of insulating material is provided between said movable plate and stationary plate preventing direct electrical contact therebetween when said movable plate is in said maximum capacitance position.

4. The variable capacitor of claim 3 wherein contact between said sheet of insulating material and said movable plate provides a stop for limiting further movement of said movable plate in response to further depression of said plunger.

5. The variable capacitor of claim 2 wherein said one end of said plunger is formed with a longitudinal slot therein defining a pair of deflectable fingers having grooves in outwardly facing portions adapted to receive edge portions of said opening of said spring washer-like element for positively securing the same to said end of said plunger.

6. The variable capacitor of claim 5 wherein said fingers are deflectable to snap fit against the edges of said opening in said spring washer-like element in said grooves.

7. The variable capacitor of claim 6 wherein said opening of said spring washer-like element is of a polygonal shape for preventing relative rotation of said spring washer-like element on said plunger.

8. The variable capacitor of claim 1 wherein said separate spring washer-like element and said plunger are interconnected with key means for preventing relative rotation therebetween around an axis normal to said substrate.

9. The variable capacitor of claim 8 including support means for said plunger including a bore for receiving a body portion of said plunger for slidable movement along said axis, said body portion and bore having a polygonal transverse cross-section for preventing relative rotation therebetween during sliding movement of said plunger on said axis.

10. A variable capacitor for use in a keyboard comprising:
   a stationary capacitor plate of thin conductive sheet material on an insulative substrate and having a substantially planar face;
   a movable member formed from a piece of thin, conductive, sheet material and including a movable capacitor plate having a substantially planar continuous face in overlying, spaced apart relation to said face of said stationary capacitor plate;
   said movable plate being struck from the body of said sheet material to provide a pair of free side edges and an outer free edge transverse thereto, a portion opposite said outer free edge projecting laterally outward of said free side edges and integral with a pair of supporting spring-like deflectable legs disposed on opposite sides of said free side edges and sloping downwardly toward said substrate to join an integral base strip spaced below and parallel of said outer free edge and adapted for mounting on said substrate to support said movable plate above said stationary plate for movement toward and away from the same to vary the capacity therebetween;

a separate element engagable with said movable plate and movable in a direction normal to said substrate for biasing said movable plate toward said stationary plate, said element including a plurality of deflectable legs with end portions extending downwardly from a central portion thereof for contact with said movable plate; and a plunger mounted for movement toward and away from said movable plate supporting said element and biased away from said movable plate.

11. The variable capacitor of claim 10 including means for biasing said element toward a minimum capacitance position with said end portions of said legs out of engagement with said movable plate.

* * * * *